United States Patent
Zhu

(10) Patent No.: US 9,250,489 B2
(45) Date of Patent: Feb. 2, 2016

(54) LCD PANEL WITH ANTI-ELECTROSTATIC DISCHARGE FUNCTION AND LCD DEVICE USING SAME

(71) Applicant: SHENZHEN CHINA STAR OPTOELECTRONICS TECHNOLOGY CO., LTD., Shenzhen (CN)

(72) Inventor: Jiang Zhu, Shenzhen (CN)

( * ) Notice: Subject to any disclaimer, the term of this patent is extended or adjusted under 35 U.S.C. 154(b) by 198 days.

(21) Appl. No.: 13/704,991

(22) PCT Filed: Nov. 23, 2012

(86) PCT No.: PCT/CN2012/085094
§ 371 (c)(1),
(2) Date: Dec. 18, 2012

(87) PCT Pub. No.: WO2014/075331
PCT Pub. Date: May 22, 2014

(65) Prior Publication Data
US 2014/0139792 A1    May 22, 2014

(30) Foreign Application Priority Data
Nov. 16, 2012   (CN) .......................... 2012 1 0462166

(51) Int. Cl.
*G02F 1/1362*    (2006.01)
*G02F 1/1345*    (2006.01)
(Continued)

(52) U.S. Cl.
CPC ........ *G02F 1/136204* (2013.01); *G02F 1/1345* (2013.01); *G02B 6/4275* (2013.01); *H01L 23/5286* (2013.01); *H01L 23/60* (2013.01); *H01L 27/0248* (2013.01); *H01L 2224/8511* (2013.01)

(58) Field of Classification Search
CPC .......... G02F 1/136204; G02F 2202/22; G02F 1/1345; G02F 2001/1555; G02B 6/4275; H01L 23/60; H01L 27/0248; H01L 2224/8511; H01L 23/5286
USPC ........................................................... 349/40
See application file for complete search history.

(56) References Cited

U.S. PATENT DOCUMENTS 7,372,514 B2 *   5/2008   Matsumoto et al. ............ 349/55
7,477,332 B2 *   1/2009   Park et al. ........................ 349/40
(Continued)

FOREIGN PATENT DOCUMENTS

CN         101231398 A     7/2008
CN         101568950 A    10/2009
(Continued)

OTHER PUBLICATIONS

Zhang Fan, the International Searching Authority written comments, Aug. 2013, CN.

*Primary Examiner* — Paisley L Arendt

(57) ABSTRACT

The present disclosure provides a liquid crystal display (LCD) panel, and an LCD device. The LCD panel includes a color filter (CF) substrate, and an array substrate. A side of the CF substrate protrudes relative to the array substrate so that at least part of a common electrode of the CF substrate are exposed to the outside, and the common electrode of the CF substrate is electrically connected with a common line of the array substrate by a conducting member. The array substrate is further configured with a ground line, and discharge points are arranged between the common line of the array substrate and the ground line of the array substrate.

3 Claims, 2 Drawing Sheets

(51) Int. Cl.
*G02B 6/42* (2006.01)
*H01L 23/528* (2006.01)
*H01L 23/60* (2006.01)
*H01L 27/02* (2006.01)

(56) References Cited

U.S. PATENT DOCUMENTS

| | | | |
|---|---|---|---|
| 7,705,282 B2* | 4/2010 | Okada | 250/208.1 |
| 7,903,186 B2* | 3/2011 | Murade | 349/40 |
| 8,159,626 B2* | 4/2012 | Hwang et al. | 349/40 |
| 2008/0218652 A1* | 9/2008 | Kim et al. | 349/40 |
| 2010/0073587 A1* | 3/2010 | Satoh | 349/40 |

FOREIGN PATENT DOCUMENTS

| | | |
|---|---|---|
| CN | 201780436 U | 3/2011 |
| EP | 0459759 A2 | 12/1991 |
| JP | 2007041096 A | 2/2007 |
| TW | I229440 B | 3/2005 |

\* cited by examiner

LCD PANEL WITH ANTI-ELECTROSTATIC DISCHARGE FUNCTION AND LCD DEVICE USING SAME

TECHNICAL FIELD

The present disclosure relates to the field of a liquid crystal display (LCD), and more particularly to an LCD panel and an LCD device.

BACKGROUND

As shown in FIG. 1 and FIG. 2, a liquid crystal display (LCD) panel in the prior art mainly includes three layers: a color filter (CF) substrate 1, an array substrate 2, and a liquid crystal (LC) layer 3. Generally, most circuits of the LCD panel are arranged on the array substrate 2, thus, the CF substrate 1 and the array substrate 2 are arranged in a staggered mode, and the array substrate 2 protrudes relative to the CF substrate 1 so that some circuits of the array substrate 2 are exposed to the outside. The exposed circuits of the array substrate 2 are laminated and interconnect with an external flexible printed circuit (FPC) 4. A transparent conducting layer (also called common electrode layer 11) of the CF substrate is interconnected with a common line of the array substrate by a conducting ball (Au ball).

In order to reduce cost, manufacturers of the LCD panel often hope to cut LCD panels having more of a big visible area using a glass substrate having a certain size, which results in less space of the LCD panel used to locate components. In order to ensure reliability of the LCD panel, a common method is to protrude a side of the CF substrate relative to the array substrate to locate components. As shown in FIG. 2, because the staggered arrangement causes a part of the transparent conducting layer of the CF substrate 1 to be exposed to the outside, the exposed part of the transparent conducting layer may be easily affected by electrostatic discharge (ESD), and circuits and related integrated chips (ICs) may be burnt out in severe cases. Because there is no etching process in a manufacturing process of the CF substrate, eliminating influence of ESD on the exposed the transparent conducting layer of the CF substrate becomes a difficult problem for engineers. One method used at present is to coat the exposed transparent conducting layer of the CF substrate with an insulating glue for protection which may increase cost and work time.

SUMMARY

In view of the above-described problems, the aim of the present disclosure is to provide a liquid crystal display (LCD) panel and an LCD device thereof with the advantages of low cost, high electro-static discharge (ESD) interference resistance, and long service life.

A first technical scheme of the present disclosure is that: an LCD panel comprises a color filter (CF) substrate and an array substrate. A side of the CF substrate protrudes relative to the array substrate so that at least part of a common electrode of the CF substrate is exposed to the outside. The common electrode of the CF substrate is electrically connected with a common line of the array substrate by a conducting member. The array substrate is further configured with a ground line, and a plurality pairs of discharge points are arranged between the common line of the array substrate and the ground line of the array substrate. The discharge points are arranged alongside the conducting member, and the conducting member is a conducting ball (Au ball). The ground line is arranged inside the common line of the array substrate, and the ground line is arranged in parallel with the common line. A side of the array substrate protrudes relative to the CF substrate so that at least some circuits of the array substrate are exposed to the outside. The exposed circuits of the array substrate 2 are laminated and interconnect with an external flexible printed circuit (FPC). The discharge points are arranged in an area adjacent to two ends of a laminated area and an area opposite to the laminated area.

A second technical scheme of the present disclosure is that: an LCD panel comprises a CF substrate and an array substrate. A side of the CF substrate protrudes relative to the array substrate so that at least part of a common electrode of the CF substrate is exposed to the outside. The common electrode of the CF substrate is electrically connected with the common line of the array substrate by a conducing member, the array substrate is further configured with a ground line, and discharge points are arranged between the common line of the array substrate and the ground line of the array substrate.

In one example, the number of pairs of discharge points between the common line of the array substrate and the ground line of the array substrate are two or more.

In one example, the discharge points are arranged alongside the conducting member. Because the common electrode is electrically connected with the common line by the conducting member, the discharge points should be arranged alongside the conducting member. Thus, electrostatic charges can be transferred to the common line from the common electrode at a short distance.

In one example, the conducting member is a conducting ball (Au ball).

In one example, the ground line is arranged inside the common line of the array substrate, and the ground line is arranged in parallel with the common line. Thus, the discharge points can be arranged at any location of the ground line and the common line to quickly discharge electrostatic charges at a short distance.

In one example, a side of the array substrate protrudes relative to the CF substrate so that at least some circuits of the array substrate are exposed to the outside. The exposed circuits of the array substrate 2 are laminated and interconnect with the external FPC. The discharge points are arranged in an area adjacent to two ends of a laminated area and an area opposite to the laminated area.

A third technical scheme of the present disclosure is that: an LCD device comprises the LCD panel mentioned above.

Advantages of the present disclosure are summarized below: in the LCD panel of the present disclosure, because a side of the CF substrate protrudes relative to the array substrate, at least part of a common electrode of the CF substrate is exposed to the outside, and the exposed part of the common electrode is easily affected by ESD. However, the LCD panel has bigger space used to locate components, which is a trend of narrower frame design. In the present disclosure, by arranging the discharge points between the common line of the array substrate and the ground line of the array substrate, when the exposed part of the common electrode of the CF substrate is affected by ESD, the electrostatic charges are transferred to the common line of the array substrate by the conducting member and discharge points discharge between the common line and the ground line. The electrostatic charges are transferred to the ground line and then flow into earth and is completely discharged which protects electrostatic, increases the ESD interference resistance of the LCD panel, reduce the production defect rate, and increases the service life. The ground line can be a newly added ground line, and can be an original ground line moved adjacent to the common line. The discharge points are easily arranged, and are manufactured in the etching process of manufacturing the common line of the array substrate and the ground line of the array substrate without increasing manufacture cost and work time basically.

DETAILED DESCRIPTION

Figure 1:
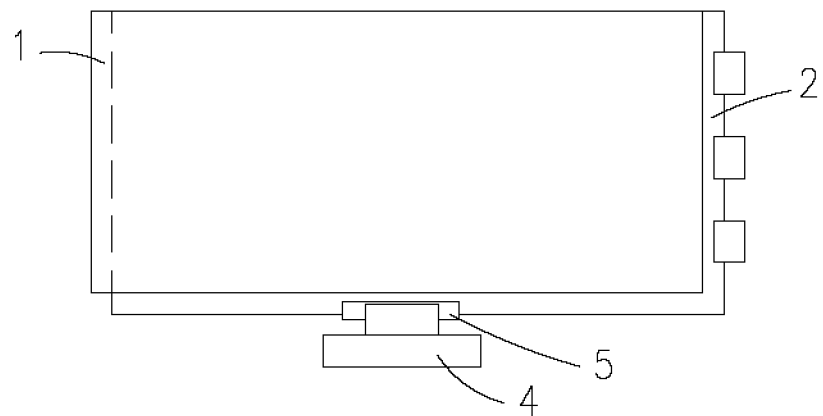
FIG. 1 is a structural diagram of a liquid crystal display (LCD) panel in the prior art.
Figure 2:
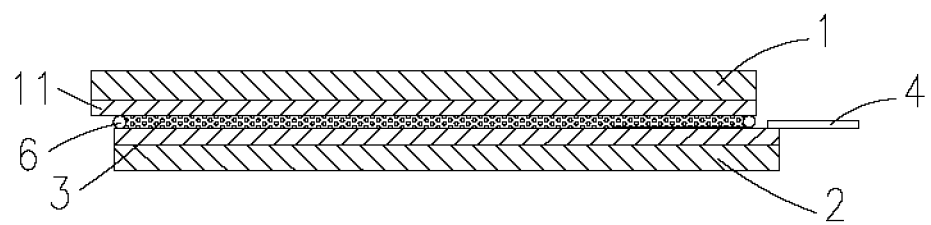
FIG. 2 is a sectional view of an LCD panel in the prior art.
Figure 3:
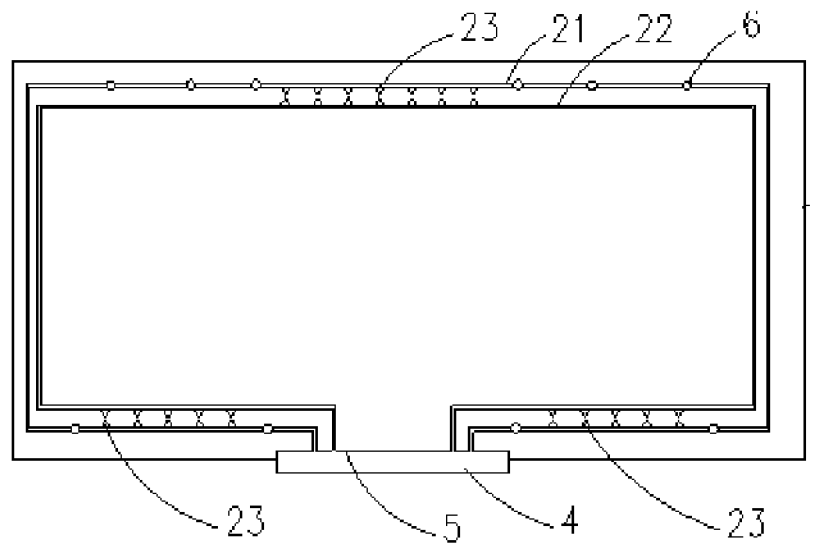
FIG. 3 is a structural diagram of an example of an LCD panel of the present disclosure.
Figure 4:
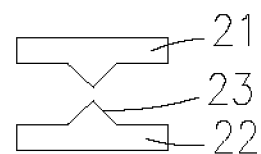
FIG. 4 is an enlarged view of a discharge point shown in FIG. 3.

The present disclosure provides a liquid crystal display (LCD) device, comprising an LCD panel. FIG. 3 and FIG. 4 show an example of the LCD panel of the present disclosure. The LCD panel comprises a color filter (CF) substrate 1 and an array substrate 2. A side of the array substrate 2 protrudes relative to the CF substrate 1 so that at least some circuits of the array substrate 2 are exposed to the outside. The exposed circuits of the array substrate are laminated and interconnect with an external flexible printed circuit (FPC) 4. A side of the CF substrate 1 protrudes relative to the array substrate 2 so that at least part of a common electrode 11 of the CF substrate 1 is exposed to the outside. The common electrode 11 of the CF substrate 1 is electrically connected with a common line 21 of the array substrate 2 by a conducting member 6. The array substrate 2 is further configured with a ground line 22, and discharge points 23 are arranged between the common line 21 of the array substrate 2 and the ground line 22 of the array substrate 2.

In the LCD panel of the present disclosure, because the side of the CF substrate 1 protrudes relative to the array substrate 2, a part of the common electrode 11 of the CF substrate 1 is exposed to the outside, and the exposed part of the common electrode 11 of the CF substrate 1 is easily affected by electrostatic discharge (ESD). However, the LCD panel has more space used to accommodate components, which is a trend of narrower frame design. In the present disclosure, by arranging the discharge points 23 between the common line 21 of the array substrate 2 and the ground line 22 of the array substrate 2, when the exposed part of the common electrode 11 of the CF substrate is affected by ESD, the electrostatic charges are transferred to the common line 21 of the array substrate 2 by the conducting member 6, and discharge points 23 discharge between the common line 21 and the ground line 22. The electrostatic charges are transferred to the ground line 22 and then flow into ground and is completely discharged. The discharging protects electrostatics, increases ESD interference resistance of the LCD panel, reduces defect rates of production, and increases service life. The ground line 22 can be a newly added ground line, and also can be an original ground line moved adjacent to the common line. The discharge points 23 are easily arranged, and are manufactured in an etching process when the common line of the array substrate and the ground line of the array substrate is manufactured without increasing manufacture cost and work time.

In the example, the conducting member 6 is a conducting ball (Au ball), where one end of the conducting ball is connected with the common electrode of the CF substrate, and the other end is connected with the common line of the array substrate. In principle, the discharge points should be arranged adjacent to the position where is easily affected by ESD. Because the common electrode 11 is electrically connected with the common line 21 by the conducting member 6, the discharge points 23 should be arranged alongside the conducting member 6. Thus, the electrostatic charges can be transferred to the common line 21 from the common electrode 11 at a short distance.

In the example, there are a plurality pairs of discharge points 23 between the common line 21 of the array substrate 2 and the ground line 22 of the array substrate 2. Because if only one pair of discharge points are arranged, sharpness of the discharge points may be damaged by multiple discharge, thereby resulting in sharp corner passivation and affecting effect of discharging of the discharge points which can be avoided by arranging a plurality pairs of discharge points.

In the example, the ground line 22 is arranged inside the common line 21 of the array substrate 2, and the ground line 22 is arranged in parallel with the common line 21. Thus, the discharge points 23 can be arranged at any location of the ground line 22 and the common line 21 to quickly discharge electrostatic charges at a short distance.

In the present disclosure, because the conducting members 6 in the prior art are arranged on a upper side and a lower side of the LCD panel in general, the discharge points 23 should be arranged on the upper side of the array substrate 2 and the lower side of the array substrate 2. Specifically, the discharge points 23 are arranged in an area adjacent to the two ends of a laminated area 5 and an area opposite to the laminated area 5. If arrangement of the areas used to arrange the discharge points 23 are reasonable, the ESD distance is short, and actual effect of the discharge can be improved.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

The invention claimed is:

1. A liquid crystal display (LCD) panel, comprising:
a color filter (CF) substrate, and
an array substrate; wherein a side of the CF substrate protrudes relative to the array substrate, and at least part of a common electrode of the CF substrate is exposed to outside; the common electrode of the CF substrate is electrically connected with a common line of the array substrate by a conducting member;
wherein the array substrate is further configured with a ground line disconnected from the common line, and the ground line is arranged in parallel with the common line, a plurality of pairs of discharge points are arranged between the common line of the array substrate and the ground line of the array substrate and the discharge points of the common line face to the discharge points of the ground line; the discharge points are arranged alongside the conducting member, and the conducting member is a conducting ball; the ground line is arranged inside the common line of the array substrate;
wherein a side of the array substrate protrudes relative to the CF substrate so that at least some circuits of the array substrate are exposed to the outside, wherein the exposed circuits of the array substrate are laminated and interconnect with an external flexible printed circuit (FPC); the discharge points are arranged in an area adjacent to two ends of a laminated area and an area opposite to the laminated area; and wherein when the exposed part of the common electrode of the CF substrate is affected by electrostatic charges, the electrostatic charges are transferred to the common line and discharged to the ground line by the discharge points.

2. A liquid crystal display (LCD) panel, comprising:

a color filter (CF) substrate, and an array substrate; wherein a side of the CF substrate protrudes relative to the array substrate, and at least part of a common electrode of the CF substrate is exposed to outside, and the common electrode of the CF substrate is electrically connected with a common line of the array substrate by a conducting member; the array substrate is further configured with a ground line disconnected from the common line, and the ground line is arranged in parallel with the common line, discharge points arranged between the common line of the array substrate and the ground line of the array substrate and the ground line of the array substrate and the discharge points of the common line face to the discharge points of the around line; and wherein when the exposed part of the common electrode of the CF substrate is affected by electrostatic charges, the electrostatic chares are transferred to the common line and discharged to the ground line by the discharge points.

3. A liquid crystal display (LCD) device, comprising:

an LCD panel comprising a color filter (CF) substrate and an array substrate; a side of the CF substrate protrudes relative to the array substrate, and at least part of a common electrode of the CF substrate is exposed to outside, and the common electrode of the CF substrate is electrically connected with a common line of the array substrate by a conducting member; the array substrate is further configured with a ground line disconnected from the common line, and the ground line is arranged in parallel with the common line, discharge points are arranged between the common line of the array substrate and the ground line of the array substrate and the ground line of the array substrate and the discharge points of the common line face to the discharge points of the ground line; and wherein when the exposed part of the common electrode of the CF substrate is affected by electrostatic charges, the electrostatic charges are transferred to the common line and discharged to the ground line by the discharge points.

* * * * *